United States Patent

Jigour et al.

[19]

[11] Patent Number: 5,991,194
[45] Date of Patent: Nov. 23, 1999

[54] METHOD AND APPARATUS FOR PROVIDING ACCESSIBLE DEVICE INFORMATION IN DIGITAL MEMORY DEVICES

[76] Inventors: Robin J. Jigour, 1435 Ranch Ct., San Jose, Calif. 95132; Asim A. Bajwa, 4955 Fontanelle Pl., San Jose, Calif. 95111

[21] Appl. No.: 08/957,094

[22] Filed: Oct. 24, 1997

[51] Int. Cl.[6] .............................. G11C 16/04; G11C 8/00
[52] U.S. Cl. .............................. 365/185.04; 365/189.03; 365/230.03; 365/230.06
[58] Field of Search ...................... 713/200; 365/230.01, 365/230.03, 230.06, 185.04, 189.03

[56] References Cited

U.S. PATENT DOCUMENTS

| | | |
|---|---|---|
| 4,451,903 | 5/1984 | Jordan . |
| 5,058,071 | 10/1991 | Kohda et al. ............................ 365/200 |
| 5,278,786 | 1/1994 | Kawauchi et al. ...................... 365/185 |
| 5,291,584 | 3/1994 | Challa et al. . |
| 5,297,081 | 3/1994 | Challa . |
| 5,381,369 | 1/1995 | Kikuchi et al. .................... 365/189.01 |
| 5,420,817 | 5/1995 | Kitagawa et al. ........................ 365/96 |
| 5,815,426 | 9/1998 | Jigour et al. . |
| 5,877,975 | 3/1999 | Jigour et al. . |

OTHER PUBLICATIONS

Nexcom Technology, Inc., Data Sheet: NexFLASH™ NX25F040A/25F080A: 4 and 8 Megabit Serial Flash Memories with SRAM, May 1997.

Nexcom Technology, Inc., Data Sheet: NexFLASH™ NX25F040A/25F080A: 4 and 8 Megabit Serial Flash Memories with SRAM, May 1997.

Nexcom Technology, Inc., Designing with the 26FXXX Series of Serial Flash Memories, AN–1A, Jul. 1997.

Nexcom Technology, Inc., NX26F080 Data Sheet Version 1.6, Mar. 1996.

*Primary Examiner*—Robert W. Beausoliel, Jr.
*Assistant Examiner*—Brian H. Shaw
*Attorney, Agent, or Firm*—David H. Carroll

[57] ABSTRACT

A memory device (100) includes a user device information sector (122) in addition to normal sectors (124) of a memory array. The user device information sector includes a product identification field (240) and a restricted address list field (250), and optionally includes a customer identification number field (220) and a serial number field (230). The product identification field includes such information as the manufacturer ID, a part number ID, package/speed identification, temperature/voltage identification, and byte locations for special options. The device identification field is factory programmed using a high voltage enabling signal applied to a write control logic circuit (102) in the memory device in conjunction with a "Device Information Sector Program" instruction is applied to the SPI command and control logic (110). The device information sector is read from the application using a "Read Device Information" instruction. Inadvertent corruption of the device information sector is avoided since a high voltage typically is not available in the application, and the "Device Information Sector Program" instruction is not in the application command set.

8 Claims, 3 Drawing Sheets

METHOD AND APPARATUS FOR PROVIDING ACCESSIBLE DEVICE INFORMATION IN DIGITAL MEMORY DEVICES

BACKGROUND OF THE INVENTION

1. Field of the Invention

The present invention relates to managing device information for digital memory devices, and more particularly to methods and apparatus for providing accessible user device information in digital memory devices.

2. Description of Related Art

Various types of digital memory devices have sectors that are formatted with user information useful for interfacing with the device. For example, the device information format provided in each sector of the NexFLASH NXS series serial memories available from Nexcom Technology, Inc. of Sunnyvale, Calif., includes sector tag/sync bytes, a device optimization code pattern, a device identification field, and a restricted sector address list. In the serial memory product number NX26F080, for example, each of up to 2048 sectors are pre-programmed during manufacture with the same device information format. While the device information format is therefore available in every sector, the manufacturer recommends that the last two sectors be maintained by the user as read-only locations for use as device information sectors for such purposes as assuring that the optimization codes, device identification, and restricted sector addresses are available for in-system use. Detailed descriptions of the device information format and of how to work with sector tag/sync bytes, device optimization code patterns, device identification fields, and restricted sector address lists are provided in two documents by Nexcom Technology, Inc., the NX26F080 Data Sheet Version 1.6, March 1996, and the application note entitled Developing With the NX26F080, AN-1, April 1996, which are incorporated herein by reference in their entirety. However, as the device user is responsible for ensuring that the device information sectors are not overwritten during use in the application, the device information sectors were sometimes inadvertently lost.

Another approach to storing user memory device information is described in U.S. Pat. No. 4,451,903, issued May 29, 1984 to Jordan and entitled "Method and Device for Encoding Product and Programming Information in Semiconductors." The device described in the Jordan patent uses multiple voltage levels on one of the row access pins to carry out the dual functions of accessing a memory array and an information array at appropriate times. The information array stores product information in read-only memory ("ROM") cells preferably of the diffusion masked ROM type, which cannot be altered once the circuit has been manufactured. Although the use of EPROM and E2PROM cells in the information array is contemplated, ROM cells are preferred since the date stored in EPROM and E2PROM cells would be entered after fabrication of the chip and thus subject to the entry of human error. The ROM cells are juxtaposed on a semiconductor die with the circuitry which performs the primary function of the chip, which includes the memory array and associated decoders, gates and buffers. Information such as manufacturer, mask set and other manufacturer-related information, as well as key circuit parameters such as supply voltages, operating currents, programming voltages, programming pulse-widths, and the like is stored in the ROM cells. To ensure that access to the data stored in the information array does not interfere with the normal operation of the primary circuit on the chip, array access logic is provided as an interface between the row address pin and the row decoder and information array. The access logic determines whether a high voltage signal is present, and disables the information array to prevent interference and enables the row decoders if conventional levels are present, and conversely disables the row decoders to prevent interference and accesses the information array if a high voltage outside of the normal voltage range for the device is present.

While ROM cells are useful for storing information predetermined by design, they are not useful for storing user device information that cannot be obtained until the device has completed testing and preparation for shipment. An example of such information is the restricted address list, which is stored in the device information sector as shown in the previously mentioned NX26F080 documents. Restricted sector devices have a limited number of sectors that do not meet manufacturing programming criteria over the specified operating range. For such devices, a restricted sector list provides a means of identifying sectors in the main array that have been determined during the manufacturer's testing to be defective and therefore appropriately restricted from use. One way of using the restricted sector list is to write the first byte of a non-restricted sector with a Tag/Sync value to identify a fully functional sector. Restricted sectors that are listed in the restricted sector list would have their first byte written to a value other than the Tag/Sync value. This easily identifies the sector as restricted or not restricted, as the case may be. It will be appreciated that the method of working with the Sector Tag/Sync bytes to assemble the restricted sector address list cannot be performed prior to mask ROM programming and completion of device fabrication. This also applies for other test-related information such as voltage, speed, and temperature grade, as well as customer and serial number identification.

Unfortunately, providing user device information in sectors of main memory places the vital device information in danger of being overwritten and corrupted. While using a high voltage outside of the normal device operating range on a multiple purpose pin to access device information in the application avoids danger of corruption, the requirement for a high voltage supply is disadvantageous in some applications, and some types of memory devices, for example serial memory devices, do not have address pins for serving a dual function. Moreover, mask and fusible link ROM is not useful for storing device information for memory devices requiring device information that cannot be obtained until the device is completed.

BRIEF SUMMARY OF THE INVENTION

An object of the present invention is to make user device information readable in the application without risk to the integrity of the information. Another object of the present invention is to make user device information readable in the application without need for a voltage supply greater than that required for normal read operations. Yet another object of the present invention is to promote reliability in the programming of user device information.

These and other objects are achieved in the present invention, which in one embodiment is a method of providing secure device information for a memory device. The method comprises applying a high voltage signal to write to a device information area of the memory device; furnishing an instruction to the memory device to program the device information sector, the instruction being accompanied by a data field containing the device information; and programming the device information sector with the device information in response to the applying and furnishing steps. A further embodiment of the method further comprises reading the device information from the device information sector using ordinary device voltages; reading data from the data area of the memory device using ordinary device voltages; and programming data into the data area of the memory device using ordinary device voltages.

Another embodiment of the invention, a digital memory, comprises a memory array; row and column decoders coupled to the memory array; a device information region coupled to the column decoders; a high voltage detector having an output coupled to an access node of the device information sector; and an instruction decoder coupled to the row and column decoders, to data nodes of the memory array, to the access node of the device information region, and to data nodes of the device information sector.

BRIEF DESCRIPTION OF THE SEVERAL VIEWS OF THE DRAWING

In the drawings, in which like reference characters indicate like parts.

DETAILED DESCRIPTION OF THE INVENTION

Figure 1:
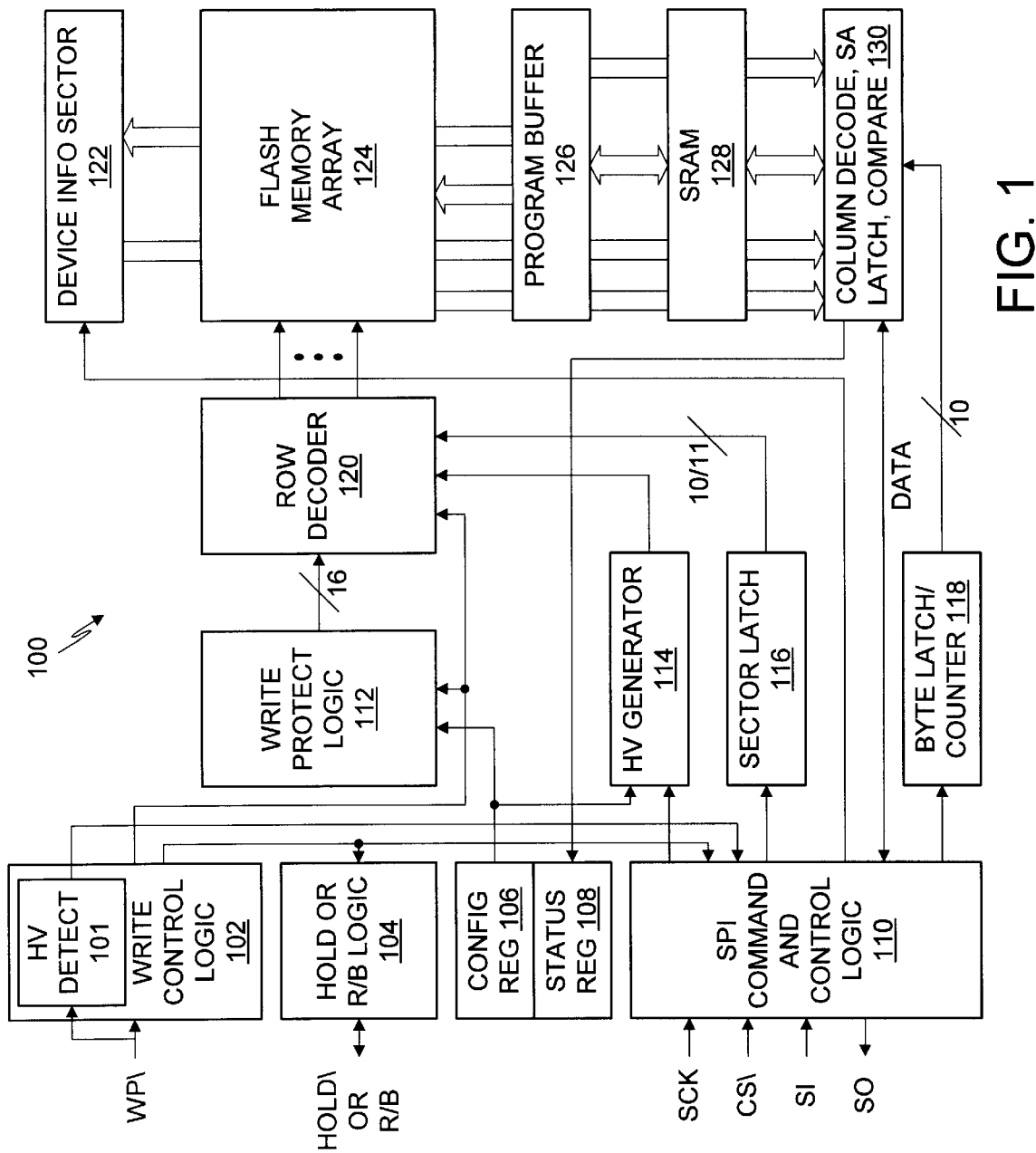
FIG. 1 is a block schematic diagram of a serial Flash memory device having a device information sector in accordance with the present invention.

FIG. 1 is a block schematic diagram of a serial Flash memory device 100 having a device information sector 122. It will be appreciated that the device information sector 122 and the techniques described herein may be used with other types of memory devices for which access to device information would be useful. Such devices include other non-volatile memories such as parallel EPROMs, EEPROMS, and Flash memories, battery-backed RAM, and serial EEPROMs. The memory device 100 is implemented on a single integrated circuit and is suitable for a variety of uses, including digital media as disclosed in U.S. Pat. No. 5,877,975, issued Mar. 2, 1999, and U.S. Pat. No. 5,815,426, issued Sep. 29, 1998, which hereby are incorporated herein in their entirety by reference thereto, and in the solid state disk drive device, or "SSD" device, disclosed in U.S. Pat. No. 5,291,584, issued Mar. 1, 1994 to Nagesh Challa and Michael E. Gannage and entitled "Method and Apparatus for Hard Disk Emulation." The device information sector is especially useful for removable media such as the previously mentioned digital media because the host system may need to identity the removable media upon insertion for proper operation and authentication.

The flash memory array 124 of the memory device 100 is fully accessible through a four-pin Serial Peripheral Interface ("SPI") bus (Clock SCK, Data In SI, Data Out SO, and Chip Select CS\) coupled to the SPI command and control logic 110. Although the SPI interface is shown in FIG. 1 and described herein, it will be appreciated that variations of the SPI interface and other serial or parallel memory interface protocols are also suitable, and include the Nexcom Serial Interface protocol, or NXS protocol, (described in the afore-mentioned patent applications of Jigour and Wong) which specifies a two-wire interface (Clock and Data I/O), I²C and μ WIRE. Returning to the device 100 of FIG. 1, note that data is written to (shifted into) the device 100 on line SO, and data is read from (shifted out of) the device 100 on line SI. All commands and data written to or read from the device 100 are clocked relative to the clock input SCK. The chip select input CS\ selects the device 100 for operation when asserted and otherwise deselects the device 100. The write-protect input WP\ applied to the write control logic 102 causes the device 100 to be write-protected when asserted, and otherwise any sector of the Flash memory array 124 can be written to unless its address is within the write protect range that is set in configuration register 106 and enforced by write protect logic 112. The hold or ready/busy port is multipurpose, serving either as a hold input or as a ready-busy output. Factory-programmed as a no-connect, the port is reconfigured by setting the configuration register 106. A status register 108 provides status of the ready/busy condition of the memory array 124, transfers between the SRAM 128 and the program buffer 126, write-enable/disable, and compare not equal carried out in the data compare logic 130, and is read using a "Read Status Register" instruction. The device 100 preferably is powered by a single power supply, typically either three volts or five volts.

The Flash memory array 124 preferably is a programmable, non-volatile memory array which is addressed by a row address decoder 120 and a column decoder 130. While various types of memory are suitable, a particularly compact programmable memory cell design and a memory array based on this cell design and which uses various voltages to control erasing, programming, and reading is described in U.S. Pat. No. 5,297,081, issued Mar. 22, 1994 to Nagesh Challa, which is hereby incorporated herein by reference in its entirety. The memory array 124 preferably is byte-addressable such that each sector is individually addressable and each byte within a sector is individually addressable. Data is read directly from a sector by issuing a "Read from Sector" instruction from the SPI bus, and is written to a sector using the SRAM 128 by issuing a "Write to Sector" instruction or a "Transfer SRAM to Sector" instruction.

Figure 2:
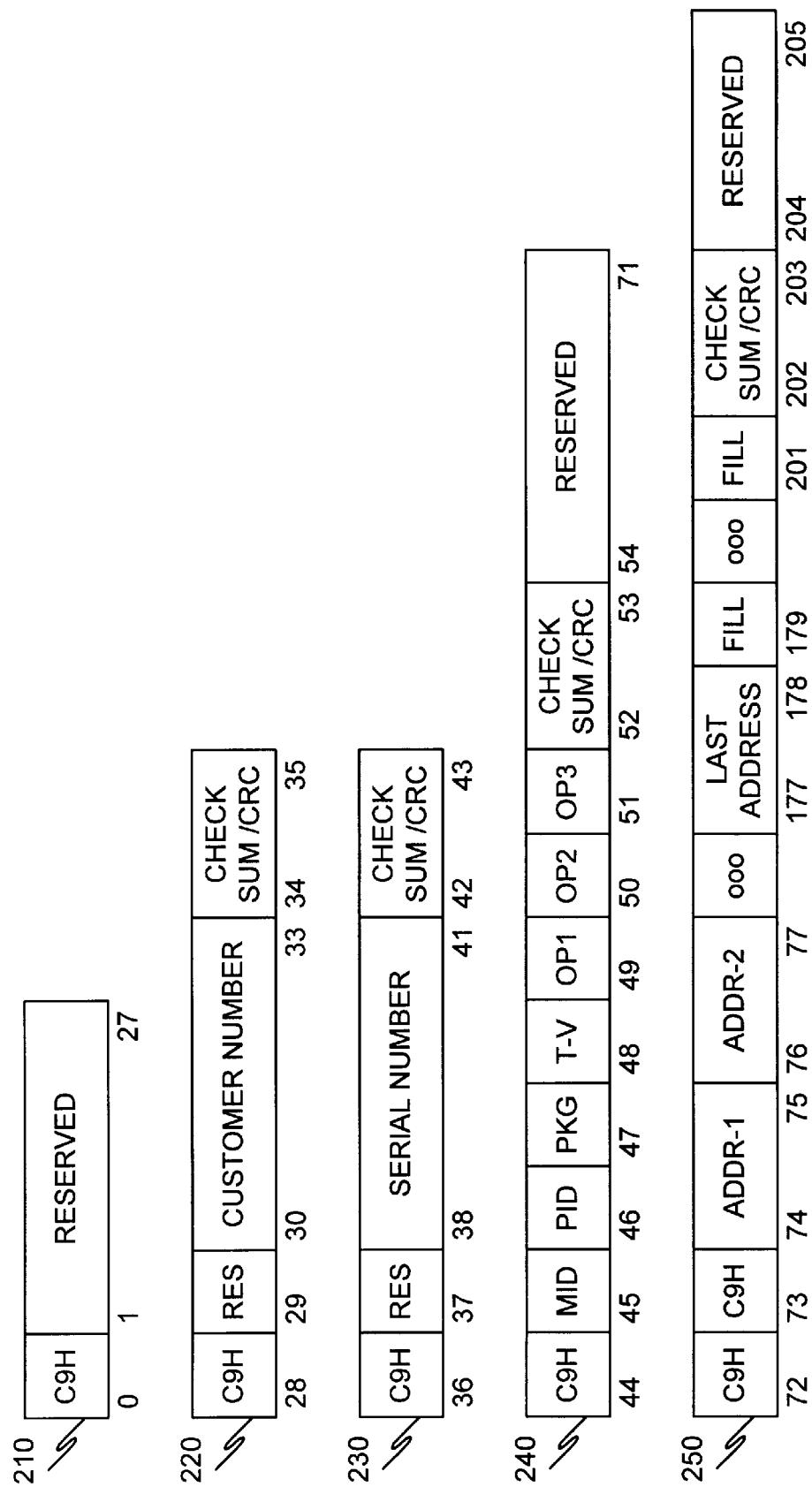
FIG. 2 is a pictorial diagram showing various fields of an illustrative device information sector in accordance with the present invention.

The device information sector 122 is a read only sector that is programmed during manufacturing but after the memory device is fabricated and packaged. It is assessable using a "Read Device Information" instruction. As shown in FIG. 2, the sector includes the following fields: a Sector Tag/Sync field 210 at bytes 0–2; a Device Identification field 240 at bytes 44–53, and a Restricted Sector Address List field 250 at bytes 72–205.

The Sector Tag/Sync field 210 provides a sync byte to verify valid clocking.

The Device Identification field 240 is useful for confirming that the correct device is being used in a given application. The field is twelve bytes long and starts at sector location forty-four. The field starts with a C9H sync-detect byte. It is then followed by a manufacturer ID byte, a part number ID byte, a package/speed byte, a temperature/voltage byte, three byte locations for special options, and two bytes of checksum or CRC.

The Restricted Sector Address List field 250 is a preferred way of avoiding restricted sectors where data integrity is important. The restricted address sector list provides the exact sector locations by address for each restricted sector. The list is compiled at the factory during memory device testing. The list starts at location seventy-two and continues with fixed fields until location two hundred five. The restricted sector address list starts with two C9H SYNC-detect bytes, followed by the two-byte restricted sector address (MSB first). The restricted sector addresses range from the lowest to the highest sectors. If the device has no restricted sectors, each address MSB and LSB will be filled with FFH. A device with an –RI or –R2 option will have at least one restricted sector address, but not more than 32 or 64 addresses respectively. Once all restricted sectors have been listed, the remaining address locations will be filled with FFH. A 16-bit Checksum is provided at the end of the field. The Checksum covers the entire list starting from the two sync bytes.

The Checksum or CRC field is provided optionally at the end of the customer number field, the device serial number field, the device identification field, and the restricted sector list. The checksum or CRC provides a simple yet effective method of confirming that data was correctly read from the device. Any suitable checksum or CRC algorithm may be used, such algorithms being well known in the art.

A Device Serial Number field 230 is an optional field that permits a unique 32-bit serial number to be programmed into a device for applications requiring device identification. Such applications include the identification of product or user through electronic means. Since the device information sector is a read-only sector, the serial number cannot be altered. Serial numbers are included as a special option to standard devices. If the serial number option is not ordered, the four serial number bytes are 00H.

Figure 3:
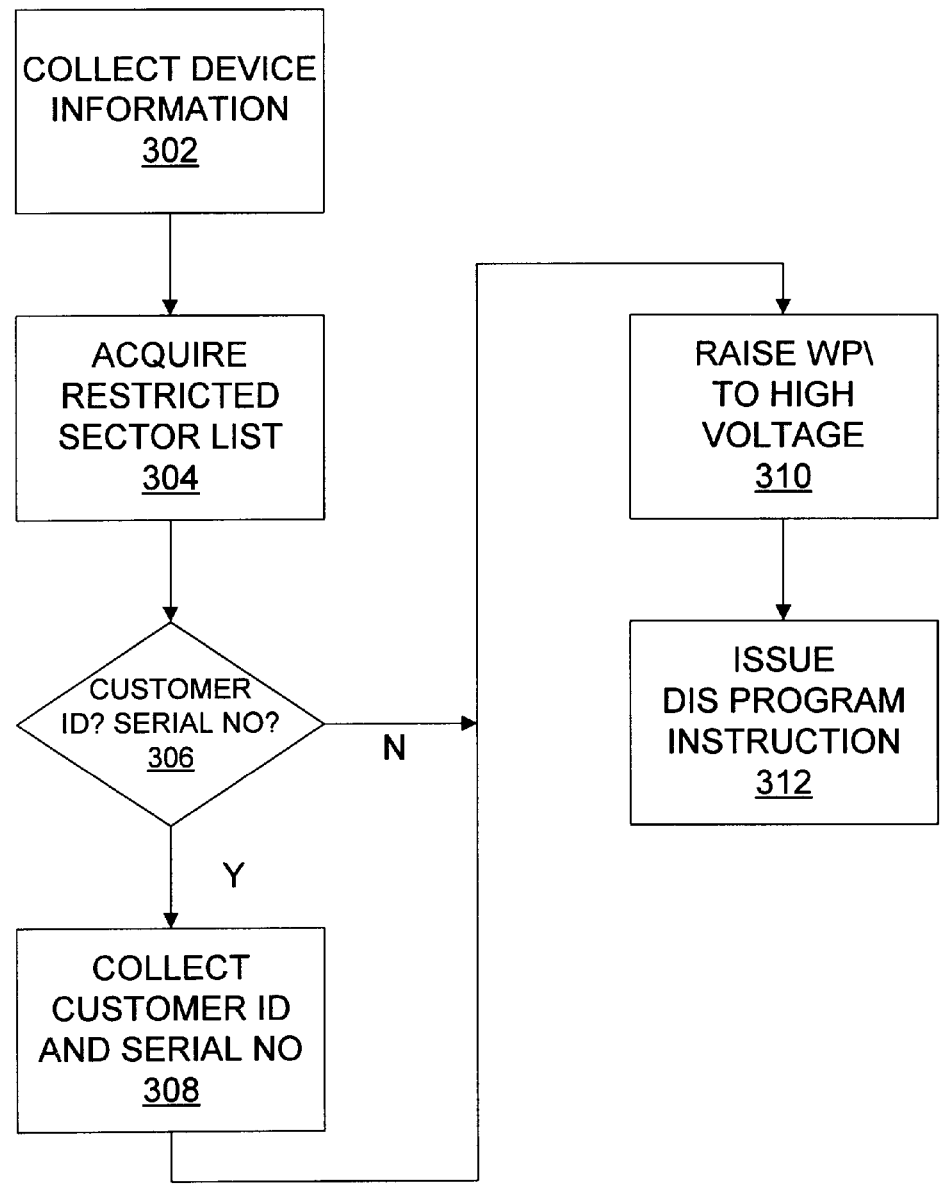
FIG. 3 is a flowchart showing an illustrative method of programming the device information sector in accordance with the present invention.

Information is programmed into the device information sector 122 as follows, with reference to FIG. 3. The method of FIG. 3 preferably is performed at the factory, preferably after fabrication and packaging of the memory device is completed and during device testing. As shown in step 302, device information is gathered for the device identification field 240 from various sources. The manufacturer ID is a number uniquely identifying the manufacturer. The part number is assigned by the manufacturer. The package type, speed data, temperature grade, and voltage are characteristics of the device, with the speed data, temperature grade, and voltage being confirmed during device test. Special options such as customizations specified by the customer and special process steps used in the fabrication also are noted. Next, as shown in step 304, each sector of the device 100 is tested to determine whether it is valid, and a restricted sector list is assembled containing invalid and therefore restricted addresses. As construction of the restricted sector list is performed at the factory by authorized and trained personnel during routine testing operations using appropriate equipment and established techniques, the restricted sector information is likely to be highly reliable. Next, if the customer has specified a customer identification number and product serial number (step 306), this information too is collected in step 308. The customer identification number is a 32-bit quantity unique to each customer, which permits the application to verify authenticity of the part by reading the customer identification number and comparing it to the expected customer identification number. The product serial number is a 32 bit quantity unique for each device and particular customer number which is read to determine whether a device is an unauthorized duplicate. While nominally 32 bits, the customer identification number and the serial number can be any desired size. Next, as shown in step 310, the input WP\ is raised to a voltage higher than normally used by the device 100, illustratively about three volts above $V_{CC}$ ($V_{CC}$ typically being about 3 or 5 volts). High voltage is readily available during testing of the device 100 by means of integrated circuit manufacturing and test equipment. The high voltage is detected by a high voltage trip buffer 101, a type of buffer well known in the art, in the write control logic 102, which in turn accesses the device information sector 122. Next, as shown in step 312, a "Device Information Sector Program" instruction is applied to the SPI command and control logic 110. The DIS Program instruction contains a data field containing the previously collected device identification information and the restricted sector address list, as well as the customer identification information and serial number, if provided. The data is loaded into the program buffer 126 via the SRAM 128, the Device Information Sector Program instruction is decoded and the device information sector 122 thereby accessed, and the device information sector 122 is programmed with the data in the program buffer in a conventional Flash memory programming operation. The high voltage applied in step 310 is an interlock mechanism that effectively prevents inadvertent programming of the device information sector 122 during normal use in the application, since high voltages are not generally available in the application. The order of steps 310 and 312 is illustrative, and step 310 may be applied after step 312 if desired to initiate programming.

Once the device 100 is factory programmed, it is suitable for use in the application. The device information sector 122 is read from the application using the "Read Device Information" instruction. Inadvertent corruption of the device information sector is avoided since a high voltage typically is not available in the application, and the "Device Information Sector Program" instruction is not in the application command set, i.e. is not available to users.

The description of the various embodiments set forth herein is illustrative of the invention as set forth in the following claims, and variations and modifications of these embodiments as well as other embodiments may be made without departing from the scope and spirit of the invention. For example, the device information "sector" may be smaller than a sector, larger than a sector, or comprise plural sectors, or the device information sector may physically be part of the main memory array and have a one-time write protect capability or may be entirely separate from the main array. Accordingly, the descriptions of the various embodiments set forth herein does not necessarily limit the scope of the invention as set forth in the following claims.

We claim:

1. A method of providing secure device information for a memory device operable at a normal dence voltage to read and write data to a data area thereof, comprising:

applying a voltage signal greater than the normal device voltage to write to a device information area of the memory device;

furnishing an instruction to the memory device to program the device information sector, the instruction being accompanied by a data field containing the device information; and programming the device information sector with the device information in response to the applying and furnishing steps.

2. A method as in claim 1 further comprising:

reading the device information from the device information sector using ordinary device voltages;

reading data from the data area of the memory device using ordinary device voltages; and programming data into the data area of the memory device using ordinary device voltages.

3. A method as in claim 1 wherein the device information comprises restricted address information.

4. A method as in claim 1 wherein the device information comprises test information.

5. A method as in claim 1 wherein the device information comprises customer and serial number information.

6. A digital memory operable at a normal device voltage to read and write data to a data area thereof; comprising:

a memory array;

row and column decoders coupled to the memory array;

a device information region coupled to the column decoders;

a voltage detector activated at a voltage greater than the normal device voltage and having an output coupled to a program-enable access node of the device information sector; and an instruction decoder coupled to the row and column decoders, to data nodes of the memory array, to the access node of the device information region, and to data nodes of the device information sector.

7. A memory device operable at a normal device voltage to read and write data to a data area thereof, comprising:

means for applying a voltage signal greater than the normal device voltage to access a device information area of the memory device, the device information area being separate from the data area of the memory device;

means for furnishing an instruction to the memory device to program the device information sector, the instruction being accompanied by a data field containing the device information; and means for programming the device information sector with the device information in response to the applying and furnishing steps.

8. A method as in claim 7 further comprising:

means for reading the device information from the device information sector using ordinary device voltages;

means for reading data from the data area of the memory device using ordinary device voltages; and means for programming data into the data area of the memory device using ordinary device voltages.

* * * * *